United States Patent
Yamaguchi et al.

(10) Patent No.: US 9,729,135 B2
(45) Date of Patent: Aug. 8, 2017

(54) GATE DRIVER

(71) Applicants: Rohm Co., Ltd., Kyoto (JP); Kyoto University, Kyoto (JP)

(72) Inventors: Atsushi Yamaguchi, Kyoto (JP); Kentaro Chikamatsu, Kyoto (JP); Takashi Hikihara, Kyoto (JP); Kohei Nagaoka, Kyoto (JP)

(73) Assignees: Rohm Co., Ltd., Kyoto (JP); Kyoto University, Kyoto (JP)

( * ) Notice: Subject to any disclaimer, the term of this patent is extended or adjusted under 35 U.S.C. 154(b) by 1 day.

(21) Appl. No.: 14/859,577

(22) Filed: Sep. 21, 2015

(65) Prior Publication Data

US 2016/0087623 A1 Mar. 24, 2016

(30) Foreign Application Priority Data

Sep. 24, 2014 (JP) .................................. 2014-193487

(51) Int. Cl.
*H03K 3/00* (2006.01)
*H03K 17/16* (2006.01)

(52) U.S. Cl.
CPC .................................. *H03K 17/161* (2013.01)

(58) Field of Classification Search
None
See application file for complete search history.

(56) References Cited

U.S. PATENT DOCUMENTS

| 5,543,994 | A | 8/1996 | Wilhelm et al. | |
|---|---|---|---|---|
| 2007/0296482 | A1* | 12/2007 | Nagata | H03K 19/0013 327/333 |
| 2012/0293219 | A1* | 11/2012 | Bai | H02M 3/1588 327/109 |
| 2014/0333365 | A1* | 11/2014 | Takahashi | H03K 3/356017 327/333 |

FOREIGN PATENT DOCUMENTS

| JP | 2886495 | 2/1999 |
|---|---|---|
| JP | 5400968 | 11/2013 |
| JP | 2013-243877 | 12/2013 |
| JP | 2014-057491 | 3/2014 |
| JP | 2014-147237 | 8/2014 |

* cited by examiner

*Primary Examiner* — Long Nguyen
(74) *Attorney, Agent, or Firm* — Fish & Richardson P.C.

(57) ABSTRACT

In a gate driver for driving a first transistor, the gate driver includes first, second and third push-pull circuits, in each of the push-pull circuits, two transistors are connected in series, an output terminal of the first push-pull circuit is connected to the gate of the first transistor, an output terminal of the second push-pull circuit is connected to the gate of a second transistor included in the first push-pull circuit and an output terminal of the third push-pull circuit is connected to the gate of a third transistor included in the first push-pull circuit.

15 Claims, 8 Drawing Sheets

GATE DRIVER

This application is based on Japanese Patent Application No. 2014-193487 filed on Sep. 24, 2014, the contents of which are hereby incorporated by reference.

BACKGROUND OF THE INVENTION

Field of the Invention
The present invention relates to gate drivers.
Description of the Related Art
As a power device that is a semiconductor device used in a power converter such as a converter or an inverter, an SiC (silicon carbide) power device is currently being developed. The SiC power device is considered to be a key device in the next generation power electronics due to its physical superiority, and is being put into commercial use.

As compared with a Si power device, the SiC power device has superior physical properties such as a high breakdown voltage, a low on-resistance, a high-speed switching characteristic and a high-temperature resistance characteristic. In particular, it is very important for reducing the size of a power converter itself to realize high-speed switching because this leads to the miniaturization of constituent components such as a capacitor, an inductor and a transformer which occupy a large volume of the power converter.

However, at present, the development of a gate driver (gate drive circuit) that performs high-speed switching drive on the SiC power device is not realized (examples of a conventional technology related to the gate driver include patent documents 1 to 5 below). Although a conventional Si (silicon) power device mainly deals with frequencies of up to about a few hundred kHz, and there are gate drivers suitable for driving Si power devices of up to such frequencies, a gate driver suitable for the SiC power device is not developed.
<Patent document 1> Japanese Unexamined Patent Application Publication No. 2014-147237
<Patent document 2> Japanese Unexamined Patent Application Publication No. 2013-243877
<Patent document 3> Japanese Unexamined Patent Application Publication No. 2014-57491
<Patent document 4> Japanese Patent No. 5400968
<Patent document 5> Japanese Patent No. 2886495

A Si-based CMOS circuit for driving an FET (field-effect transistor) at high frequencies is well known. However, in the CMOS circuit, the signal application is limited, and in order to drive, at a high speed, the SiC power device provided in the power converter, large charge transfer for a large input capacity is instantaneously needed, with the result that it is impossible to achieve driving with the CMOS circuit without being processed. Driving with the CMOS circuit causes a greater loss, and thus it is impossible to take advantage of the superiority of the SiC power device.

In order to take advantage of the physical properties of a wideband gap semiconductor such as the SiC power device, in the driving thereof, it is necessary to use an element having such a property as to take advantage of the properties, and thus it can be considered that an element formed of GaN (gallium nitride) or SiC is used to realize the CMOS circuit. However, both in GaN and SiC, only an n-type MOSFET is currently being developed, and consideration is not given to the CMOS circuit of a bridge structure that cannot be achieved without realizing a p-type MOSFET. Even when a p-type MOSFET is realized, since the mobility of holes of SiC or GaN is significantly lower than that of electrons, it is unlikely that it is possible to realize a CMOS circuit which can be driven at a high speed.

Although a circuit mounting technology for reducing noises caused by driving at frequencies of up to a few hundred kHz used often in power electronics or at frequencies of a GHz band used in high-speed communication is currently developed, a circuit technology for driving in a few to a few hundred MHz band which can be used in power electronics is not developed except a circuit for dealing with extremely low power of about a few watts or the technological level thereof is significantly immature. Hence, in reality, it is common to avoid such high-frequency driving. However, if a drive circuit for driving in a few to a few hundred MHz band is developed, it is expected that the development of technology for reducing noises will progress.

As described above, the inventors of the present application uniquely focus attention on the conditions in which at present, the driving of a power device at frequencies of a few to a few hundred MHz is not realized.

SUMMARY OF THE INVENTION

In view of the foregoing conditions, an object of the present invention is to provide a gate driver that drives, at a high speed, a transistor which is a drive target.

In order to achieve the above object, according to the present invention, there is provided a gate driver for driving a first transistor, the gate driver including: first, second and third push-pull circuits, where in each of the push-pull circuits, two transistors are connected in series, an output terminal of the first push-pull circuit is connected to a gate of the first transistor, an output terminal of the second push-pull circuit is connected to a gate of a second transistor included in the first push-pull circuit and an output terminal of the third push-pull circuit is connected to a gate of a third transistor included in the first push-pull circuit (first configuration).

In the first configuration, the first push-pull circuit may have a half-bridge structure in which the second and third transistors having the same polarity are connected in series (second configuration).

In the first or second configuration, the second and third push-pull circuits may have the same configuration (third configuration).

In any one of the first to third configurations, the second and third push-pull circuits may have a structure in which transistors having different polarities are connected in series (fourth configuration).

In any one of the first to fourth configurations, cutoff frequencies of the second and third transistors may be higher than a cutoff frequency of the first transistor (fifth configuration).

In any one of the first to fifth configurations, input capacitances of the second and third transistors may be less than an input capacitance of the first transistor (sixth configuration).

In any one of the first to sixth configurations, an output capacitance of the third transistor may be less than an input capacitance of the first transistor (seventh configuration).

In any one of the first to seventh configurations, threshold voltages of the second and third transistors may be 5 V or less (eighth embodiment).

In any one of the first to eighth configurations, a connection point between the second and third transistors in the first push-pull circuit may be connected to the gate of the first transistor, a first electrical terminal of the second push-pull circuit which is not connected to the second transistor may be connected to the connection point, a capacitor may be connected between a second electrical terminal of the second push-pull circuit which is different from the first electrical terminal and the first electrical terminal and a diode may be connected between the second electrical terminal and the third push-pull circuit connected to the third transistor such that a direction pointing from the third push-pull circuit to the second push-pull circuit is a forward direction (ninth configuration).

In the ninth configuration, a capacitance (Cbs) of the capacitor may be set so as to satisfy formula below (tenth configuration): Cbs×Vb>Ciss×5 [V] where Vb represents a voltage applied to the second push-pull circuit, and Ciss represents an input capacitance of the second transistor.

In the ninth or tenth configuration, the diode may have a reverse breakdown voltage equal to or more than a voltage applied to the second transistor and a reverse recovery time equal to or less than 1% of a switching period of the first transistor (eleventh configuration).

In any one of the first to eleventh configurations, each of the second and third transistors may have an on-resistance (Ron) satisfying formula below (twelfth configuration): Ron≤Va×Ton/Qg where Va represents a voltage applied to the first push-pull circuit, Qg represents a gate charge of the first transistor and Ton represents a time during which the first transistor is kept on.

In any one of the first to twelfth configurations, a wiring may be provided such that a wiring distance between the second push-pull circuit and the second transistor is substantially equal to a wiring distance between the third push-pull circuit and the third transistor (thirteenth configuration).

In any one of the first to thirteenth configurations, the second and third transistors may be an n-type FET (fourteenth configuration).

In any one of the first to fourteenth configurations, the first transistor may be a voltage-driven transistor of SiC (silicon carbide) (fifteenth configuration).

In any one of the first to fifteenth configurations, the second and third transistors may use, as a channel material, GaN (gallium nitride) or SiC (silicon carbide) (sixteenth configuration).

In any one of the first to sixteenth configurations, the first, second and third push-pull circuits may be arranged on the same substrate, and the whole thereof may be covered by an insulator into a module (seventeenth configuration).

DETAILED DESCRIPTION OF THE PREFERRED EMBODIMENTS

An embodiment of the present invention will be described below with reference to drawing.

<Overall Configuration of a Gate Driver>

Figure 1:
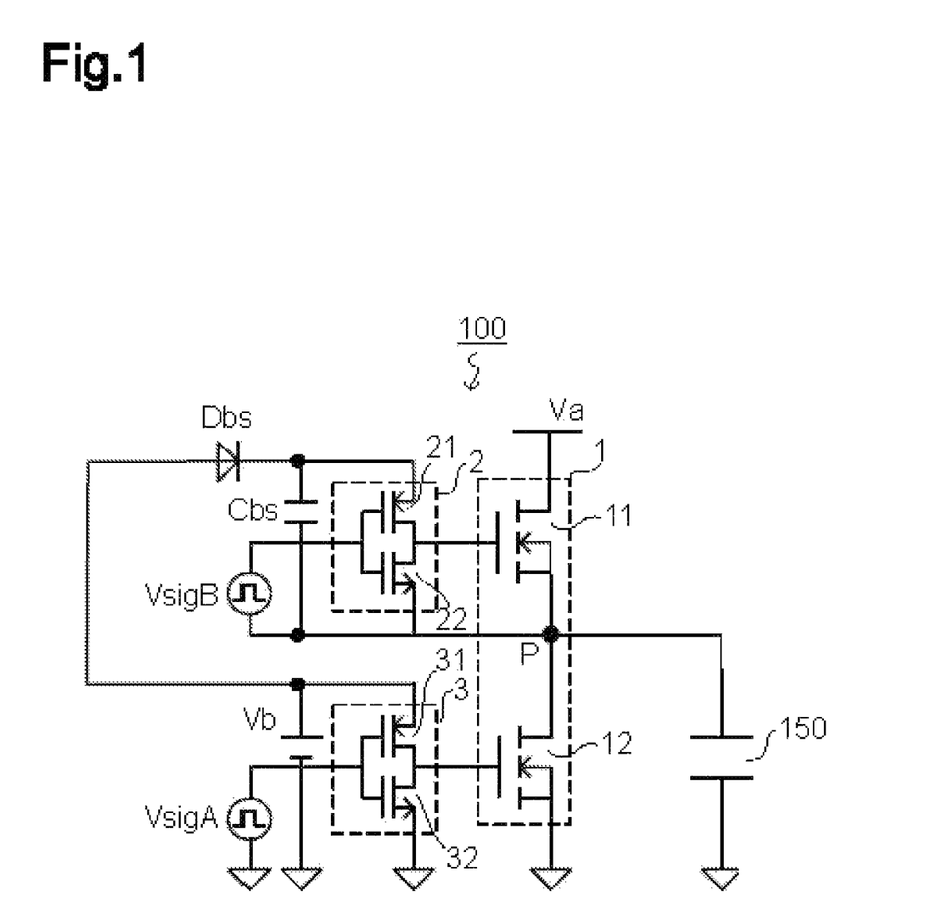
FIG. 1 is a diagram showing the circuit configuration of a gate driver according to an embodiment of the present invention.

The circuit configuration of a gate driver according to an embodiment of the present invention is shown in FIG. 1. The gate driver 100 shown in FIG. 1 is a circuit that drives a SiC MOSFET 150 (an example of a first transistor) which is a drive target. The SiC MOSFET 150 used in a power converter is a voltage-driven SiC power device. In FIG. 1, the SiC MOSFET 150 is shown in the model of an input capacity.

The gate driver 100 includes a first push-pull circuit 1, a second push-pull circuit 2, a third push-pull circuit 3, a bootstrap capacitor Cbs and a diode Dbs.

The first push-pull circuit 1 has a half-bridge structure in which a GaN HEMT 11 (High Electron Mobility Transistor) (an example of a second transistor) and a GaN HEMT 12 (an example of a third transistor) are connected in series. When the connection relationship will be described more specifically, the drain of the GaN HEMT 11 is connected to the application terminal of an input voltage Va. The source of the GaN HEMT 12 is connected to the ground terminal. The source of the GaN HEMT 11 and the drain of the GaN HEMT 12 are connected to a connection point P, and the connection point P (the output terminal of the first push-pull circuit 1) is connected to the gate of the SiC MOSFET 150.

Since at present, in the GaN power device, the development of a p-channel type does not progress as compared with an n-channel type, the n-channel type is adopted both for the GaN HEMT 11 in the upper stage and the GaN HEMT 12 in the lower stage. Hence, for the GaN HEMTs in the upper and lower stages, a gate driver circuit and a drive power supply are needed.

The second push-pull circuit 2 is a circuit that performs gate drive on the GaN HEMT 11 in the upper stage, and is formed by connecting, in series, a p-type MOSFET 21 and an n-type MOSFET 22 both of which are formed of Si. The connection point (the output terminal of the second push-pull circuit 2) between the drain of the p-type MOSFET 21 and the drain of the n-type MOSFET 22 is connected to the gate of the GaN HEMT 11.

The third push-pull circuit 3 is a circuit that performs gate drive on the GaN HEMT 12 in the lower stage, and is formed by connecting, in series, a p-type MOSFET 31 and an n-type MOSFET 32 both of which are formed of Si. The connection point (the output terminal of the third push-pull circuit 3) between the drain of the p-type MOSFET 31 and the drain of the n-type MOSFET 32 is connected to the gate of the GaN HEMT 12.

When a p-type MOSFET of GaN or SiC is developed in the future, the devices in the second push-pull circuit 2 and the third push-pull circuit 3 can be replaced with the n-type MOSFET and the p-type MOSFET of GaN or SiC.

It is preferable to perform design such that a wiring distance from the second push-pull circuit 2 to the gate of the GaN HEMT 11 in the upper stage and a wiring distance from the third push-pull circuit 3 to the gate of the GaN HEMT 12 in the lower stage are substantially equal. This is because as long as a high-frequency signal is not a pure sine wave, the waveform of a signal collapses by being passed through a wiring, and thus as the frequency to be driven is increased, in a long wiring distance or the wiring of a different length, a problem such as the collapse of the waveform or timing deviation occurs as a drive signal.

The application terminal of the drive power supply voltage Vb of the GaN HEMT 12 in the lower stage is connected to the source of the p-type MOSFET 31 of the third push-pull circuit 3.

As the drive power supply of the GaN HEMT 11 in the upper stage, a bootstrap system using the bootstrap capacitor Cbs and the reverse blocking diode Dbs is adopted. In this way, a power supply other than the power supply voltage Vb does not need to be newly provided in the upper state.

When the connection relationship will be described more specifically, one end of the bootstrap capacitor Cbs is connected both to the connection point P and to the source of the n-type MOSFET 22 in the second push-pull circuit 2. The other end of the bootstrap capacitor Cbs is connected both to the cathode of the reverse blocking diode Dbs and to the source of the p-type MOSFET 21 in the second push-pull circuit 2. The anode of the reverse blocking diode Dbs is connected both to the application terminal of the power supply voltage Vb and to the source of the p-type MOSFET 31 in the third push-pull circuit 3.

Furthermore, a drive control signal VsigA in the lower stage and a drive control signal VsigB in the upper stage are inverted in phase and are input such that the GaN HEMT 11 in the upper stage and the GaN HEMT 12 in the lower stage alternately become electrically continuous.

Figure 2:
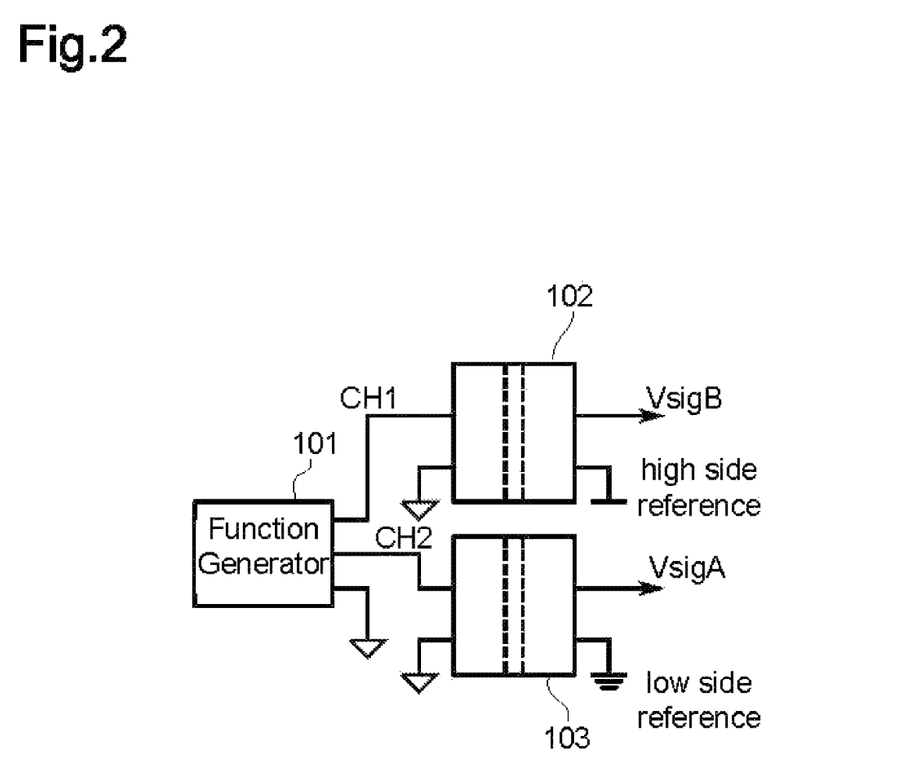
FIG. 2 is a diagram showing the configuration of generation of a drive control signal according to the embodiment of the present invention.

Here, an example of a configuration for generating the drive control signals VsigA and VsigB is shown in FIG. 2. As shown in FIG. 2, the drive control signals VsigA and VsigB are signals that are obtained by transmitting, with isolators 102 and 103, through an insulating part, signals generated by a function generator (drive control signal generation circuit) 101. A reference potential is divided by the isolators 102 and 103 in the upper stage and the lower stage. The function generator can be replaced with an IC having the same function, and as a power supply circuit, it is actually preferable to perform such replacement.

<Operation of the Gate Driver>

The operation of the gate driver 100 will then be described. When the drive control signal VsigA is low, in the third push-pull circuit 3, the p-type MOSFET 31 becomes electrically continuous, and the GaN HEMT 12 in the lower stage becomes electrically continuous by the power supply voltage Vb. Here, since the drive control signal VsigB is high, the n-type MOSFET 22 in the second push-pull circuit 2 becomes electrically continuous, and the GaN HEMT 11 in the upper stage becomes electrically noncontinuous. Here, since the connection point P has a ground potential, the reverse blocking diode Dbs is forward biased to become electrically continuous, and the bootstrap capacitor Cbs is charged by the power supply voltage Vb.

When the drive control signal VsigA is high, since the n-type MOSFET 32 in the third push-pull circuit 3 is turned on, and thus the GaN HEMT 12 in the lower stage becomes electrically noncontinuous. Here, since the drive control signal VsigB is low, the p-type MOSFET 21 in the second push-pull circuit 2 becomes electrically continuous, and the GaN HEMT 11 in the upper stage becomes electrically continuous using the bootstrap capacitor Cbs as a power supply.

<Circuit Setting of the Gate Driver>

The circuit setting of the gate driver 100 will then be described. The cutoff frequency of each of the GaN HEMT 11 in the upper stage and the GaN HEMT 12 in the lower stage is set higher than the cutoff frequency of the SiC MOSFET 150 which is the drive target. This is because a device capable of being operated faster than the device of the drive target needs to be used as a device for driving. Since the GaN HEMT has high electron mobility, it is possible to set a cutoff frequency higher than the cutoff frequency of the SiC MOSFET 150, and since the GaN HEMT switches the SiC MOSFET 150 at a high speed of the order of MHz or more, it is a candidate for the optimum device.

The input capacity of each of the GaN HEMT 11 and the GaN HEMT 12 is set lower than the high input capacity of the SiC MOSFET 150 serving as a power device. When the input capacity is low, since the amount of charge needed to be instantaneously transferred needs to be low, driving at the signal level of the second push-pull circuit 2 and the third push-pull circuit 3 can be performed. This condition is not limited to the HEMT, and can be applied even when another device is selected as the device forming the first push-pull circuit 1.

The gate threshold voltage of each of the GaN HEMT 11 and the GaN HEMT 12 is set at 5 V or less. This is because in general, signal-system IC devices are designed so as not to be operated at a high voltage, and in order for the range of circuit elements capable of being used to be extended, even a drive device that does not have a high threshold voltage easily acquires the flexibility of design, with the result that it leads to a cost down, which is important in the industry. In this way, driving at the signal level of the second push-pull circuit 2 and the third push-pull circuit 3 can be performed.

The on-resistance Ron of each of the GaN HEMT 11 and the GaN HEMT 12 is set so as to satisfy formula (1) below.

$$Ron \leq Va \times Ton/Qg \qquad (1)$$

where Va represents a voltage applied to the source of the GaN HEMT 11, Qg represents the gate charge of the SiC MOSFET 150 and Ton represents the time during which the SiC MOSFET 150 is kept on.

Qg is an amount that indicates the amount of charge needed to open the gate. In order to repeatedly perform an on/off operation at a desired fast drive frequency, it is necessary to transfer charge corresponding to Qg during a desired time. This is the meaning of Qg/Ton having the dimension of current. Since the current corresponding to Qg/Ton is actually made by a voltage Va applied to the first push-pull circuit 1 and Ron of the transistor forming the first push-pull circuit 1, Qg/Ton needs to be achieved by a current which is determined by Va/Ron and which can be passed through the first push-pull circuit 1. This condition can be expressed by Va/Ron≥Qg/Ton, and by transforming this formula, it is possible to obtain formula (1) above.

Even if large charge transfer is instantaneously needed for a large input capacity of the SiC MOSFET 150 used in a power converter, formula (1) above can be satisfied by the GaN HEMT whose general features are a low on-resistance and a high mutual conductance.

When the GaN HEMT 11 in the upper stage becomes electrically continuous, it appears from the GaN HEMT 11 in the upper stage that the output capacitance of the GaN HEMT 12 in the lower stage is connected in parallel to the input capacitance of the SiC MOSFET 150. In other words, when seen from the GaN HEMT 11 in the upper stage, the output capacitance of the GaN HEMT 12 in the lower stage is an extra capacitance that needs to be charged. Hence, it is necessary to minimize this extra capacitance to realize rapid driving, the output capacitance of the GaN HEMT 12 is set lower than the input capacitance of the SiC MOSFET 150.

The circuit setting in the bootstrap will then be described.

The capacitance value of the bootstrap capacitor Cbs is first set so as to satisfy formula (2) below.

$$Cbs \times Vb > Ciss \times 5 \ [V] \quad (2)$$

where Vb represents a power supply voltage applied to the second push-pull circuit 2 and Ciss represents the input capacitance of the GaN HEMT 11.

In other words, as described above, when the gate threshold voltage of the GaN HEMT 11 is set at 5 V or less, the amount of charge which is higher than the amount of charge needed to be charged to the input capacitance of the GaN HEMT 11 can be charged to the bootstrap capacitor Cbs.

Since the input capacitance of the GaN HEMT 11 is low, it is possible to decrease the capacitance value of the bootstrap capacitor Cbs. Hence, it is possible to use, as the bootstrap capacitor Cbs, a ceramic chip capacitor having a low capacitance.

The setting of the reverse blocking diode Dbs will then be described. When the GaN HEMT 12 in the lower stage is electrically noncontinuous, since the reverse blocking diode Dbs needs to block the input voltage Va, the reverse breakdown voltage of the reverse blocking diode Dbs is set at the input voltage Va or more.

Since the reverse recovery time of the reverse blocking diode Dbs needs to be shorter than the switching period of the SiC MOSFET 150, the reverse recovery time is set at 1% or less of the switching period.

<Drive Test of the SiC Power Device>

Figure 3:
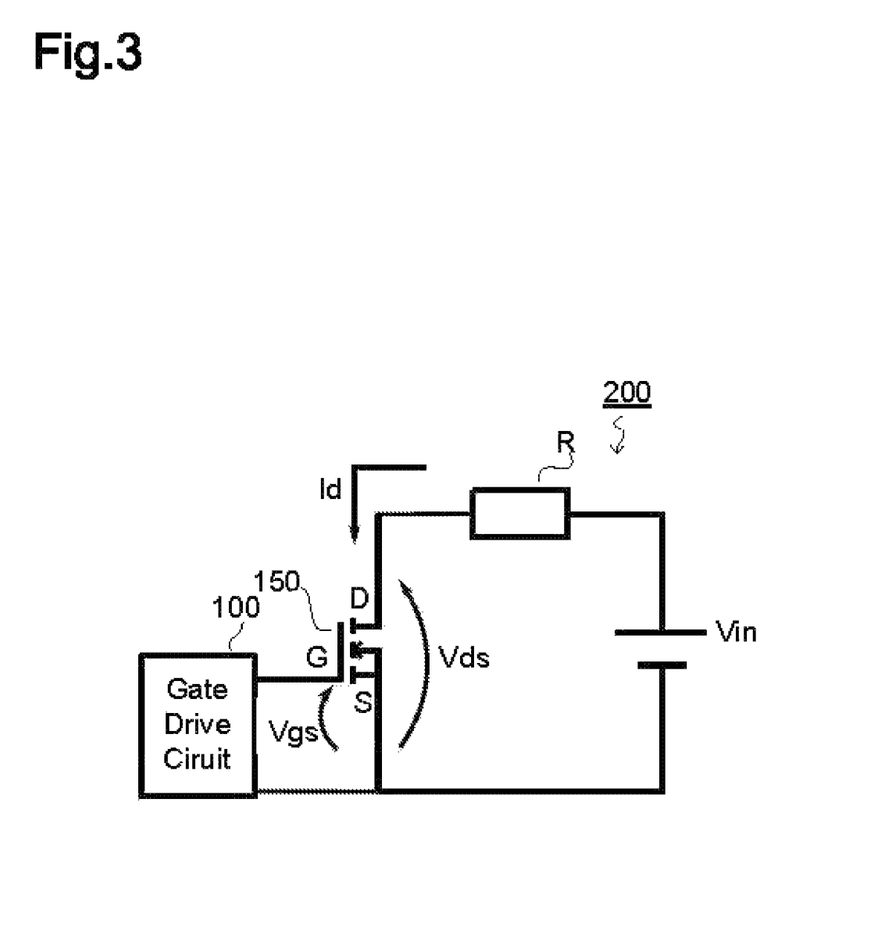
FIG. 3 is a diagram showing the configuration of a resistance load circuit used in a drive test in the embodiment of the present invention.

A drive test of the SiC MOSFET 150 with the gate driver 100 configured as described above was performed. In the drive test, a resistance load circuit 200 as shown in FIG. 3 was formed. The gate driver 100 shown in FIG. 3 has the configuration shown in FIG. 1. As the SiC MOSFET 150 used in this test, a SiC MOSFET 150 having a trench-type structure was used. The setting of a test circuit, a measurement target and a measurement system in the test and the test result will be described below.

<<Setting of the Test Circuit>>

The circuit setting of the gate driver 100 formed in the test will first be described. The gate drive voltage of the SiC MOSFET 150 was set to have a high level of 18 V and a low level of 0 V. Hence, the input voltage Va shown in FIG. 1 was set at 18 V.

The drive power supply voltage Vb of the GaN HEMT 12 in the lower stage was set at 4 V. The bootstrap capacitor Cbs serving as the drive power supply of the GaN HEMT 11 in the upper stage needs to have such a capacitance value that the input capacitance of the GaN HEMT 11 can be charged up to 4 V. Hence, the capacitance value of the bootstrap capacitor Cbs was set at 330 nF such that the input capacitance was set at 500 pF and formula (2) above was sufficiently satisfied.

Then, as described previously, when the GaN HEMT 12 in the lower stage is electrically noncontinuous, the reverse blocking diode Dbs needs to block the input voltage Va of 18 V, and the reverse breakdown voltage of the reverse blocking diode Dbs needs to be 18 V or more, and thus the reverse blocking diode Dbs here was set at 30 V. The switching period of the SiC MOSFET 150 was set at 100 ns corresponding to the 10 MHz, and the reverse recovery time was set at 0.8 ns equal to or less than 1% of 100 ns. As the reverse blocking diode Dbs having the reverse breakdown voltage and the reverse recovery time described above, DB2J316 made by Panasonic Corporation was used.

As the n-type MOSFET and the p-type MOSFET in the second push-pull circuit 2 and the third push-pull circuit 3, n-channel/p-channel MOSFETS (US6M1 made by ROHM Co., Ltd.) were used.

Furthermore, the drive control signals VsigA and VsigB were generated by transmitting an oscillation signal generated by the function generator 101 (AFG3102C made by Tektronix Company) through a digital isolator IC (Si8660 made by Silicon Laboratories) which were isolators 102 and 103. The isolators need to transmit a drive signal at the signal level of a few to a few hundred MHz capable of performing the gate drive. As shown in FIG. 2, the signals corresponding to the drive control signals VsigB and VsigA were input from the channels 1 and 2 (CH1 and CH2) of the function generator 101.

A description will be given of the resistance load circuit 200 shown in FIG. 3. A resistor R was set at 47Ω, and a voltage Vin was set at 50 V. Hence, when the SiC MOSFET 150 was electrically continuous, a drain current Id was set at about 1 A.

<<Measurement Target and Measurement System>>

Measurements were made on the switching characteristic of the SiC MOSFET 150 and the operation on the side of the gate driver 100.

With respect to the switching characteristic of the SiC MOSFET 150, the gate-source voltage Vgs, the drain-source voltage Vds and the drain current Id of the SiC MOSFET 150 shown in FIG. 3 were measured. In the measurements, an oscilloscope (MDO4104-3 made by Tektronix Company) was used. Here, in the voltage measurements, a voltage probe (TPP 1000 made by Tektronix Company) was used, and in the current measurements, a current probe (TCP0030 made by Tektronix Company) was used.

With respect to the side of the gate driver 100 shown in FIG. 1, the gate-source voltage VgHgan of the GaN HEMT 11 in the upper stage, the gate-source voltage VgLgan of the GaN HEMT 12 in the lower stage, a signal Vos1 from the channel 1 of the function generator 101 (FIG. 2) serving as the base of VsigA and a signal Vos2 from the channel 2 of the function generator 101 serving as the base of VsigB were measured. In the measurements, an insulation oscilloscope (TPS2024 made by Tektronix Company) was used. A voltage probe (P2220 made by Tektronix Company) was used.

Notes on the measurement results will be described here. As described above, data on the side of the gate driver 100 and data on the switching characteristic were measured with different oscilloscopes. Hence, the time axes of the two measurement results have different references, and timing differs between two graphs.

<<Test Result when the Switching Frequency was 1 MHz>>

Figure 4:
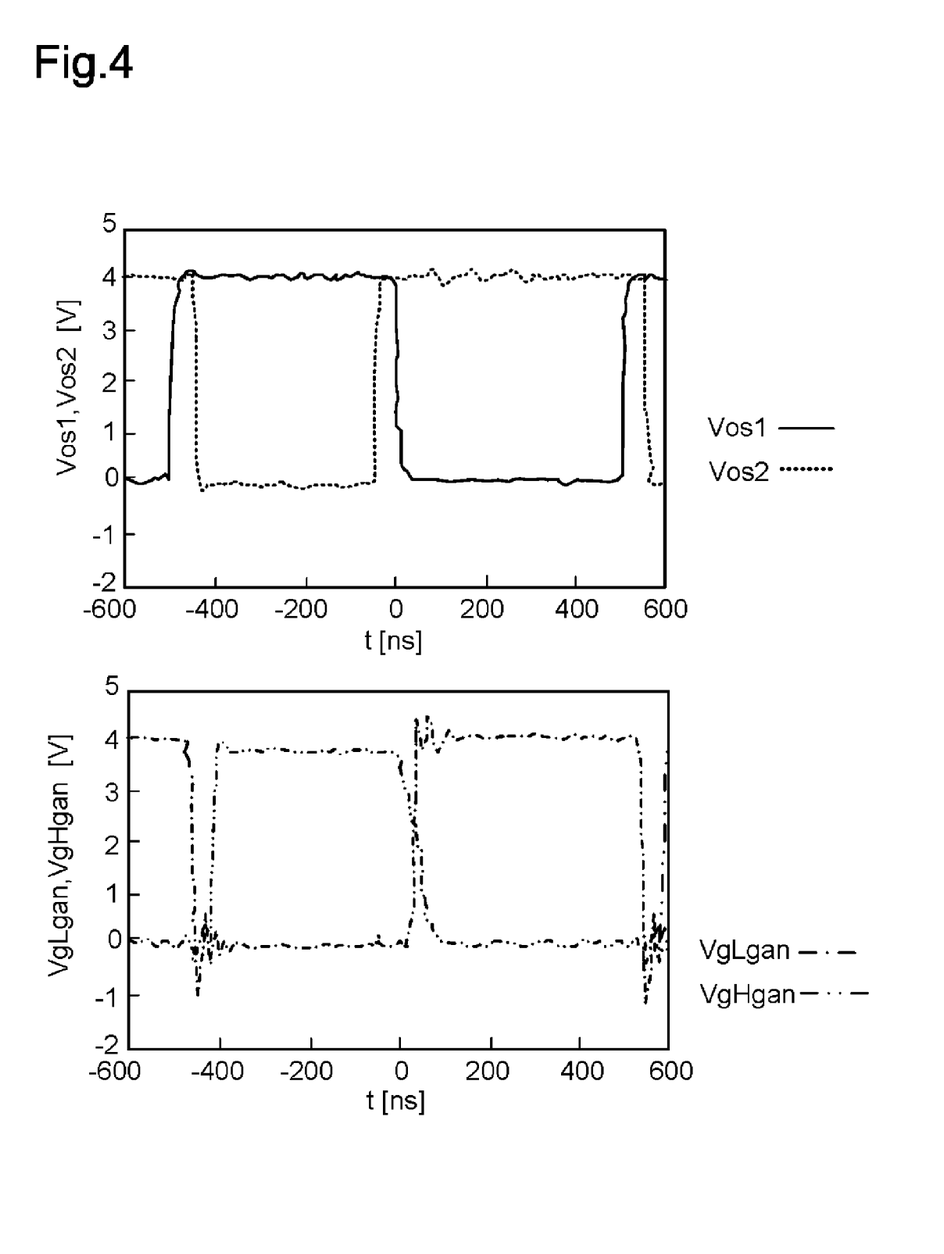
FIG. 4 is a graph showing various measurement results on the side of the gate driver in the drive test in the embodiment of the present invention (when a switching frequency is 1 MHz)

The measurement results of Vos1, Vos2, VgLgan and VgHgan when the switching frequency was 1 MHz were shown in FIG. 4. The switching characteristic of the SiC MOSFET 150 is shown in FIG. 5.

A phase relationship of individual voltage waveforms in FIG. 4 will be described. VgHgan and VgLgan were generated by the second push-pull circuit 2 and the third push-pull circuit 3 driving the GaN HEMTs 11 and 12 shown in FIG. 1. Hence, in FIG. 4, VgLgan whose phase was reversed with respect to Vos1 was generated. The same was true for Vos2 and VgHgan.

In order to drive the SiC MOSFET 150, it is necessary to make the GaN HEMTs 11 and 12 in the upper and lower stages alternately become electrically continuous. Hence, in order to reverse the phases of VgLgan and VgHgan, Vos1 and Vos2 were generated by the function of the function generator 101 (FIG. 2). It is also necessary to prevent both the two GaN HEMTs 11 and 12 from becoming electrically continuous at the same time. Hence, the duty ratio and the phase relationship of Vos1 and Vos2 were adjusted by the function of the function generator 101 such that the time during which both VgLgan and VgHgan were high was minimized.

Figure 5:
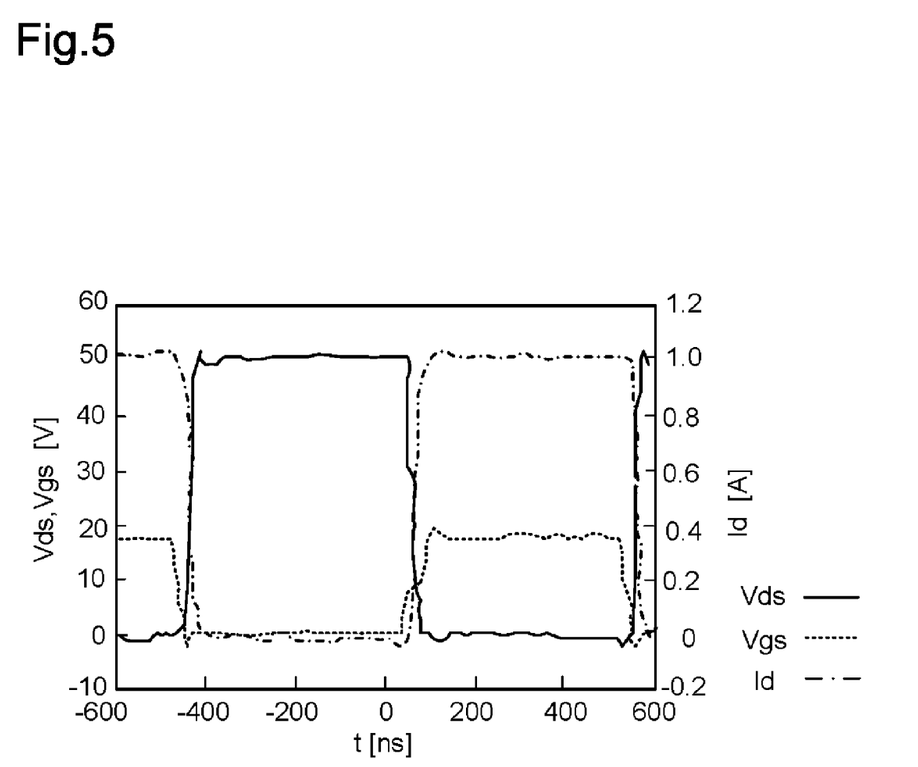
FIG. 5 is a graph showing various measurement results on the switching characteristic of an SiC MOSFET in the drive test in the embodiment of the present invention (when a switching frequency is 1 MHz)

Consequently, as shown in FIG. 5, Vgs at a frequency of 1 MHz and at a voltage value of 0 to 18 V was generated. Then, since in the waveforms of Vds and Id shown in FIG. 5, the part where Vds and Id crossed each other was small so as to produce little loss, switching at the switching frequency of 1 MHz was achieved.

It is found from the above results that with the gate driver 100 of the configuration shown in FIG. 1, it is possible to drive the SiC MOSFET 150.

<<Test Result when the Switching Frequency was 10 MHz>>

Figure 6:
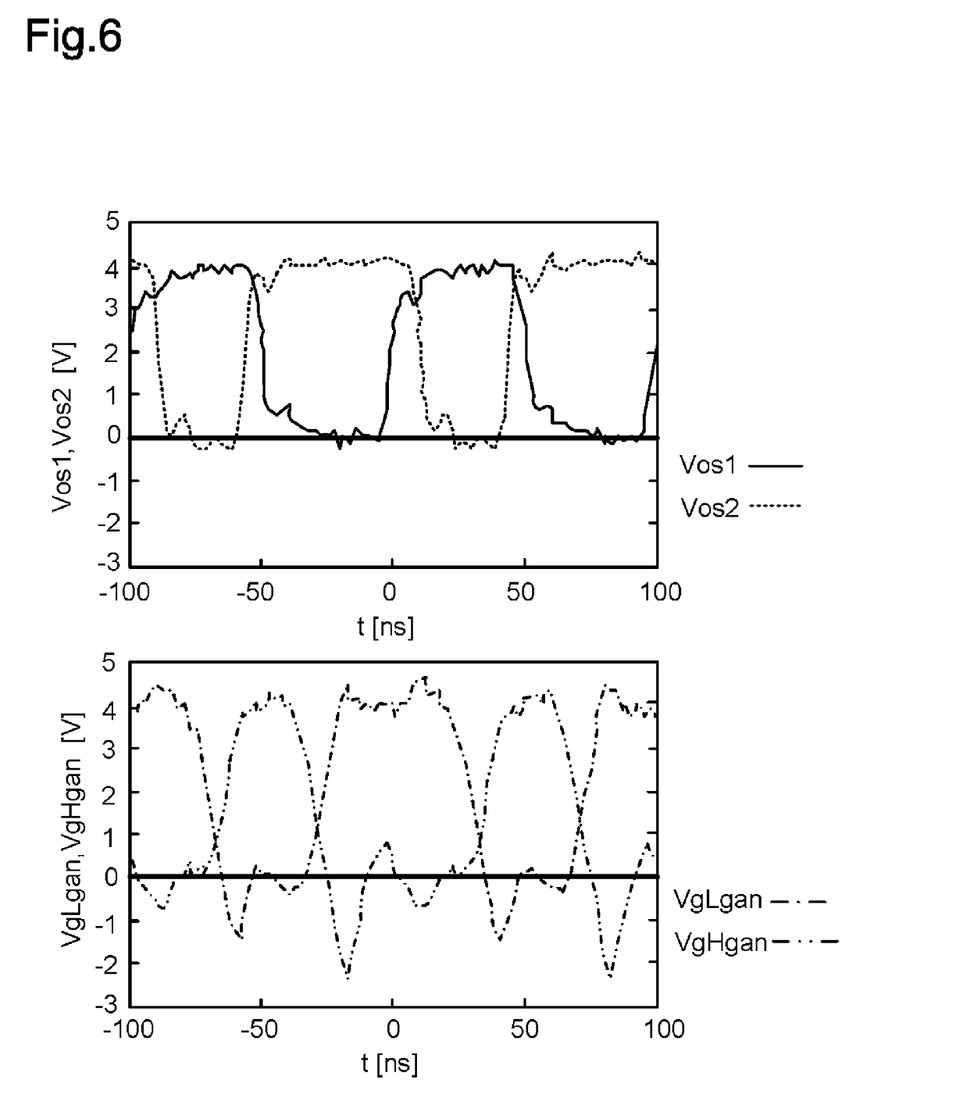
FIG. 6 is a graph showing various measurement results on the side of the gate driver in the drive test in the embodiment of the present invention (when a switching frequency is 10 MHz)

The measurement results of Vos1, Vos2, VgLgan and VgHgan when the switching frequency was 10 MHz were shown in FIG. 6. The switching characteristic of the SiC MOSFET 150 is shown in FIG. 7.

Figure 7:
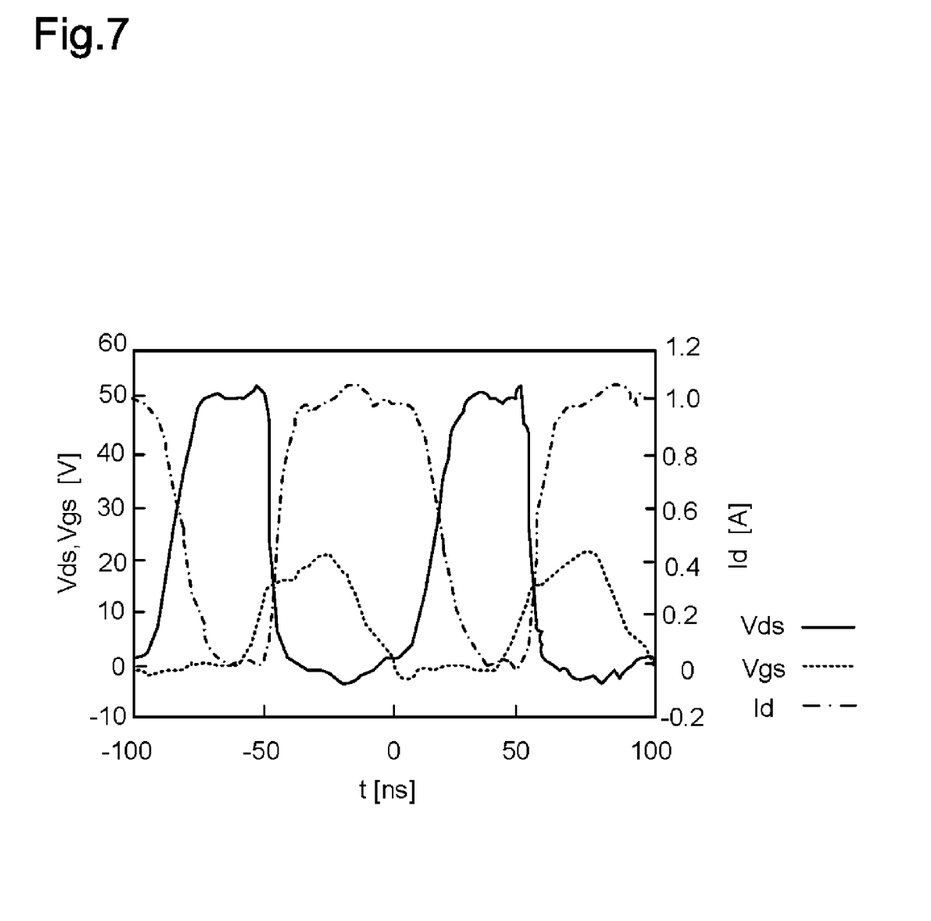
FIG. 7 is a graph showing various measurement results on the switching characteristic of the SiC MOSFET in the drive test in the embodiment of the present invention (when a switching frequency is 10 MHz)

As is found from FIG. 7, even at a high frequency of 10 MHz, Vgs was generated, and thus the switching of the SiC MOSFET 150 was achieved. It is found from the test result shown in FIG. 6 that the time ratio in which VgLgan was high was set larger. The reason thereof will be described.

As is found from FIG. 7, in the switching characteristic of the SiC MOSFET 150 used in the test, the turning off thereof is delayed with respect to the turning on thereof. Hence, in order to achieve the switching, it is necessary to set a sufficient time during which Vgs was low, that is, to set a sufficient time during which the GaN HEMT 12 in the lower stage was electrically continuous. Hence, as shown in FIG. 6, the time ratio in which VgLgan was high was adjusted to be enough to achieve the switching.

As described above, when the switching frequency was such a high frequency as to be 10 MHz, though the drive timing including the transient characteristic of the SiC MOSFET 150 needed to be adjusted, as shown in FIG. 7, the driving and switching of the SiC MOSFET 150 at 10 MHz were achieved.

<<Achieved Excellent Effects>>

The embodiment of the present invention described above is excellent in the following points. First, without being affected by the experience of the Si power device, the technology (signal RF insulating circuit element) of the signal insulation of the Si power device is applied to the signal insulation, and a bridge using the GaN power device capable of performing switching at the power level with driving at the signal level is applied to driving for high-frequency switching, with the result that the driving of the intended SiC power device is realized by such driving.

Then, both in GaN and SiC, at present, only elements having an n-type MOS structure are developed, and it is expected that in the GaN device, it is difficult to develop a p-type MOS in the future, and hence, the n-type MOS bridge capable of driving at a high frequency is realized so as to correspond to the properties of the SiC power device which is the output target. Since even in Si, the driving of the p-type MOS is also slow, that only the n-type element is used to achieve the configuration as in the present invention is useful even for the Si device.

Consequently, the driving of the SiC power device at frequencies of a few to a few hundred MHz is achieved.

<Modularization of the Gate Driver>

Figure 8:
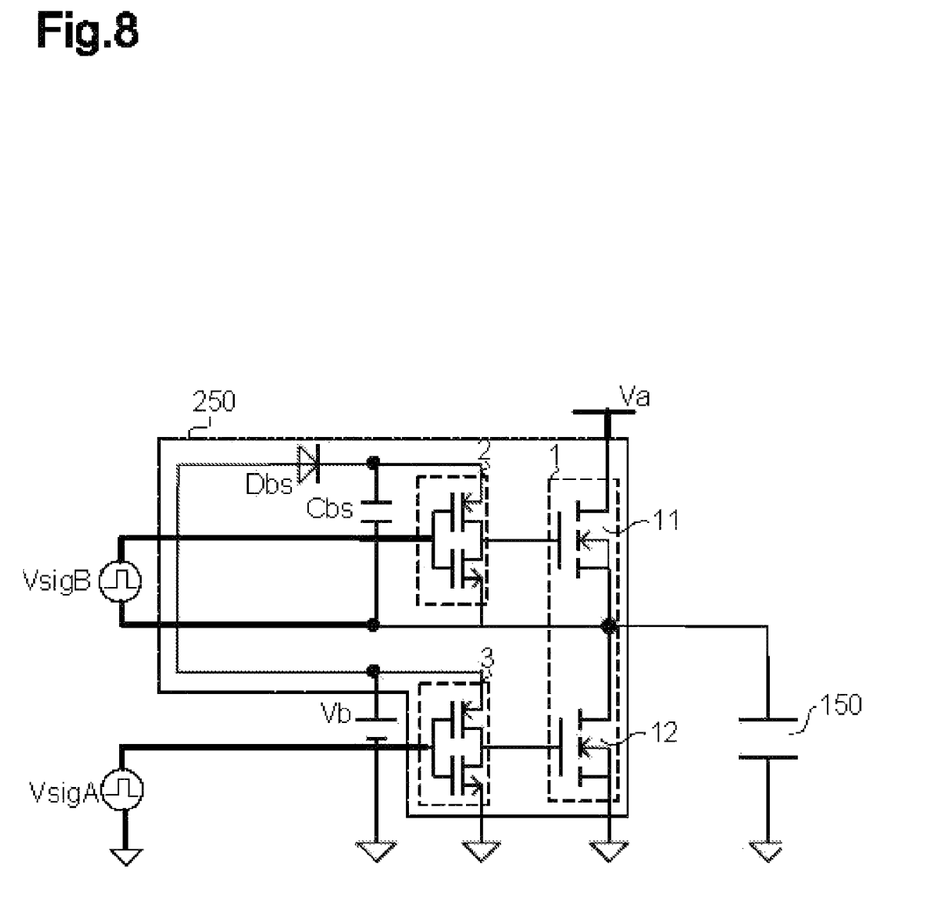
FIG. 8 is a diagram showing a gate driver module in the embodiment of the present invention.

The gate driver 100 is formed with the circuit elements suitable for modularization such as the GaN HEMT 11 in the upper stage, the GaN HEMT 12 in the lower stage, the second push-pull circuit 2, the third push-pull circuit 3, the bootstrap capacitor Cbs which is a small capacitance ceramic chip capacitor and the reverse blocking diode Dbs. Hence, these circuit elements are mounted on the same substrate and are connected via bonding wires or the like, and thereafter a multichip module 250 (FIG. 8) having a structure sealed with a resin (an example of an insulator) may be formed.

<<Other Variations>>

In the configuration of the present invention, in addition to the embodiment described above, various modifications can be added without departing from the spirit of the invention. Specifically, it should be considered that the embodiment described above is illustrative in all respects and not restrictive, the technical range of the present invention is indicated not by the description of the embodiment described above but by the scope of claims and meanings equivalent to the scope of claims and all modifications within the scope should be understood to be included.

For example, although in the embodiment described above, as the transistors in the upper and lower stages forming the bridge structure, the GaN HEMTs are used, the application of SiC having the same properties as GaN as a channel material also falls within the range of the spirit of the present invention. In this case, the transistors in the upper and lower stages to which SiC is applied and the SiC MOSFET 150 which is the drive target are integrated into one chip, and thus it is also possible to form a multichip module in which the chip, the second push-pull circuit 2, the third push-pull circuit, the bootstrap capacitor Cbs and the reverse blocking diode Dbs are arranged on the same substrate.

INDUSTRIAL APPLICABILITY

The present invention is a technology that has not yet been realized in any organization in the world, and is one of the key technologies for maintaining superiority in the industry of our country in the development of the next-generation power electronics using a wideband gap semiconductor. Consequently, there is a possibility that the development of the wideband gap semiconductor in the industrial field of high-frequency applications will be significantly facilitated. The market is very large, and it is possible to enhance the technology of power electronics serving as simple energy saving technology to the technology of power processing. As examples thereof, it is natural that the technology is useful for the miniaturization of power electronics circuits, and the technology can be considered to be necessary in the integration of the basic circuits proposed by the inventors of the present application such as a power packet transmission technology and a power routing technology or the conversion of a power device into an integrated circuit. It is also a significant effect that as a result of the present invention, attention is focused on the development of all SiC high-frequency power integrated modules incorporating a drive circuit, and thus the expectation of the application is facilitated.

What is claimed is:

1. A gate driver for driving a first transistor, the first transistor being a voltage-driven transistor of SiC (silicon carbide), the gate driver comprising:
   first, second and third push-pull circuits,
   wherein in each of the push-pull circuits, two transistors are connected in series,
   an output terminal of the first push-pull circuit is connected to a gate of the first transistor,
   an output terminal of the second push-pull circuit is connected to a gate of a second transistor included in the first push-pull circuit,
   an output terminal of the third push-pull circuit is connected to a gate of a third transistor included in the first push-pull circuit and
   cutoff frequencies of the second and third transistors are higher than a cutoff frequency of the first transistor.

2. The gate driver according to claim 1,
wherein the first push-pull circuit has a half-bridge structure in which the second and third transistors having the same polarity are connected in series.

3. The gate driver according to claim 1,
wherein the second and third push-pull circuits have the same configuration.

4. The gate driver according to claim 1,
wherein the second and third push-pull circuits have a structure in which transistors having different polarities are connected in series.

5. The gate driver according to claim 1,
wherein input capacitances of the second and third transistors are less than an input capacitance of the first transistor.

6. The gate driver according to claim 1,
wherein an output capacitance of the third transistor is less than an input capacitance of the first transistor.

7. The gate driver according to claim 1,
wherein threshold voltages of the second and third transistors are 5 V or less.

8. The gate driver according to claim 1,
wherein a connection point between the second and third transistors in the first push-pull circuit is connected to the gate of the first transistor,
a first electrical terminal of the second push-pull circuit is connected to the connection point,
a capacitor is connected between a second electrical terminal of the second push-pull circuit which is different from the first electrical terminal and the first electrical terminal and
a diode is connected between the second electrical terminal and the third push-pull circuit connected to the third transistor such that a direction pointing from the third push-pull circuit to the second push-pull circuit is a forward direction.

9. The gate driver according to claim 8,
wherein a capacitance (Cbs) of the capacitor is set so as to satisfy formula below:

$$Cbs \times Vb > Ciss \times 5 \ [V]$$

where Vb represents a voltage applied to the second push-pull circuit, and Ciss represents an input capacitance of the second transistor.

10. The gate driver according to claim 8,
wherein the diode has a reverse breakdown voltage equal to or more than a voltage applied to the second transistor and a reverse recovery time equal to or less than 1% of a switching period of the first transistor.

11. The gate driver according to claim 1,
wherein each of the second and third transistors has an on-resistance (Ron) satisfying formula below:

$$Ron \leq Va \times Ton/Qg$$

where Va represents a voltage applied to the first push-pull circuit, Qg represents a gate charge of the first transistor and Ton represents a time during which the first transistor is kept on.

12. The gate driver according to claim 1,
wherein a wiring is provided such that a wiring distance between the second push-pull circuit and the second transistor is substantially equal to a wiring distance between the third push-pull circuit and the third transistor.

13. The gate driver according to claim 1,
wherein the second and third transistors are an n-type FET.

14. The gate driver according to claim 1,
wherein the second and third transistors use, as a channel material, GaN (gallium nitride).

15. The gate driver according to claim 1,
wherein the first, second and third push-pull circuits are arranged on the same substrate, and the whole thereof is covered by an insulator into a module.

* * * * *